US006762957B2

(12) United States Patent
Hsu et al.

(10) Patent No.: US 6,762,957 B2
(45) Date of Patent: Jul. 13, 2004

(54) LOW CLOCK SWING LATCH FOR DUAL-SUPPLY VOLTAGE DESIGN

(75) Inventors: Steven K. Hsu, Lake Oswego, OR (US); Bhaskar P. Chatterjee, Waterloo (CA); Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 222 days.

(21) Appl. No.: 10/027,795

(22) Filed: Dec. 20, 2001

(65) Prior Publication Data

US 2003/0117933 A1 Jun. 26, 2003

(51) Int. Cl.[7] .................................................. G11C 7/10
(52) U.S. Cl. .............. 365/189.05; 365/190; 365/189.11; 365/227; 326/81; 326/80
(58) Field of Search ....................... 365/189.05, 189.11, 365/227, 228, 189.06, 190; 326/28, 27, 26, 58, 57, 56, 81, 80

(56) References Cited

U.S. PATENT DOCUMENTS

| | | | |
|---|---|---|---|
| 4,996,453 A | 2/1991 | Zanders et al. ............... 326/81 |
| 5,382,838 A | 1/1995 | Sasaki et al. ............... 327/108 |
| 5,508,648 A | 4/1996 | Banik .......................... 327/203 |
| 5,751,174 A | 5/1998 | Kuo et al. ................... 327/199 |
| 5,767,716 A | 6/1998 | Ko .............................. 327/203 |
| 5,825,205 A | 10/1998 | Ohtsuka ....................... 326/81 |
| 5,872,476 A | 2/1999 | Mihara et al. ............... 327/333 |
| 5,880,617 A | 3/1999 | Tanaka et al. ............... 327/333 |
| 5,929,687 A | 7/1999 | Yamauchi .................... 327/333 |
| 5,929,688 A | 7/1999 | Ueno et al. .................. 327/333 |
| 6,011,421 A | 1/2000 | Jung ........................... 327/333 |
| 6,091,260 A * | 7/2000 | Shamarao ..................... 326/27 |
| 6,211,713 B1 | 4/2001 | Uhlmann ..................... 327/211 |
| 6,225,846 B1 | 5/2001 | Wada et al. ................. 327/215 |
| 6,242,942 B1 * | 6/2001 | Shamarao ..................... 326/27 |
| 6,456,136 B1 | 9/2002 | Sutherland et al. ......... 327/225 |

OTHER PUBLICATIONS

Kawaguchi, H., et al., "A CMOS Scheme for 0.5V Supply Voltage with Pico–Ampere Standby Current", *ISSCC, IEEE 1998*, Slide Supplement, 154–155, 12.4–1–12.4–4, (1998).

Kuroda, T., et al., "A 0.9–V, 150–MHz, 10–mW, 4 mm2, 2–D Discrete Cosine Transform Core Processor with Variable Threshold–Voltage (VT) Scheme", *IEEE Journal of Solid–State Circuits, vol. 31*, 1770–1779, (Nov. 1996).

Usami, K., et al., "Automated Low–Power Technique Exploiting Multiple Supply Voltages Applied to a Media Processor", *IEEE Journal of Solid–State Circuits, vol. 33*, 463–471, (Mar. 1998).

* cited by examiner

*Primary Examiner*—Andrew Q. Tran
(74) *Attorney, Agent, or Firm*—Schwegman, Lundberg, Woessner & Kluth, P.A.

(57) ABSTRACT

A dual-supply voltage latch includes a data input node to receive an input data, internal nodes to hold the input data, and an output node to output an output data. The latch also includes clock input nodes to receive a clock signal. The data input, internal, and data output nodes are at a higher potential than the clock nodes. Since clock nodes are high activity nodes, less potential on these nodes reduces the energy consumed by the latch. Although the data nodes and clock nodes are at different potentials, the latch has reduced static power dissipation.

27 Claims, 6 Drawing Sheets

LOW CLOCK SWING LATCH FOR DUAL-SUPPLY VOLTAGE DESIGN

FIELD

The present invention relates generally to latches, and more specifically to latches in dual-supply voltage designs.

BACKGROUND

Latch circuits are widely used to temporarily store data and transfer the data from one part of a circuit to another part of the circuit. Integrated circuits such as microprocessors and memory devices often include a number of latch circuits and typically have a single supply voltage. However, because of demand for longer battery life in ultra low-power microprocessors and other circuits, designers have proposed a concept of dual-supply voltages. It has been shown that a large percentage of the overall energy consumed in a synchronous microprocessor is due to the clocking. Therefore, if the clock signal swing can be reduced, there can be significant savings in energy as well.

FIG. 1A shows a conventional latch 100 for use in a dual-supply circuit. Latch 100 receives an input signal Din and outputs an output signal Dout. Latch 100 has a data path that includes transistors P1 and N1 and an inverter I1. Latch 100 also has a feedback path that includes inverters I2 and I3 and transistors P2 and N2. Clock signals CLK and CLK* control the data and feedback paths. An inverter I4 receives the CLK signal and outputs the CLK* signal. Inverters I1, I2, and I3 connect to a supply voltage Vcch and inverter I4 connects to a supply voltage Vccl; Vcch is greater than Vccl. The Din and Dout signals are Vcch signals. The CLK and CLK* signals are Vccl signals. A Vccl signal has a high potential level corresponding to Vccl; a Vcch signal has a high potential level corresponding to Vcch, which is greater than Vccl. Both Vccl and Vcch have the same low potential level, e.g., zero or ground.

When the CLK signal switches from zero to Vccl, the CLK* signal switches to zero. Transistor N1 turns on fully and passes the Din signal to node A. Inverter I1 receives the potential level at node A and produces an output signal Dout at the output node of the latch. Inverters I2 and I3 receives the potential level at node A and store it at node B. During this time, transistor N2 turns off fully. However, if the data at node A from the current cycle is different from the data at node B from the previous cycle, transistor P2 only turns off partially, leading to charge contention.

When the CLK signal switches from Vccl to zero, the CLK* signal switches to Vccl. Transistor N1 turns off fully but transistor P1 only turns off partially. Therefore, if the potential level of the Din signal is different from the potential level at node A, static power dissipation would occur. The charge contention and static power dissipation lead to poor performance.

FIG. 1B shows another conventional latch 150. Latch 150 includes internal nodes X and Y. Transistors M1 and M2 connect to nodes X and Y and to transistor M3 and inverter IN1 to allow node X or Y to discharge to ground, in response to a potential level of a clock signal CLK. Cross-coupled inverters IN2 and IN3 connect to node X and Y to operate as a feedback loop.

When the CLK signal switches from zero to Vccl, transistor M3 turns on. Depending on the level of the Din signal, either node X or Y selectively discharges to ground through transistors M1 and M3 or M2 and M3. Inverters IN2 and IN3 hold the Din signal as potential levels at nodes X and Y. Inverter IN4 receives the potential level at node Y and produces an output signal Dout signal at the output node of the latch. As long as the CLK signal is at Vccl, latch 150 is transparent and the Din signal is available at the output of latch 150 as the Dout signal.

When the CLK signal switches from Vccl to zero, transistor M3 turns off, stopping the effect of the Din signal on nodes X and Y. However, inverters IN2 and IN3 hold nodes X and Y at the previous potential level of the Din signal until the CLK signal switches to Vccl.

A problem arises when node X or Y discharges to ground but node X or Y holds an opposite potential level from the previous cycle. For example, when the CLK signal switches from zero to Vccl and the Din signal is at Vcch, transistor M1 turns on and node X discharges to ground. However, if node X holds the Vcch potential, discharging to ground would cause a charge contention, leading to poor performance.

For the reasons stated above, and for other reasons stated below which will become apparent to those skilled in the art upon reading and understanding the present specification, there is a need for an improved latch.

DESCRIPTION OF EMBODIMENTS

Figure 1A:
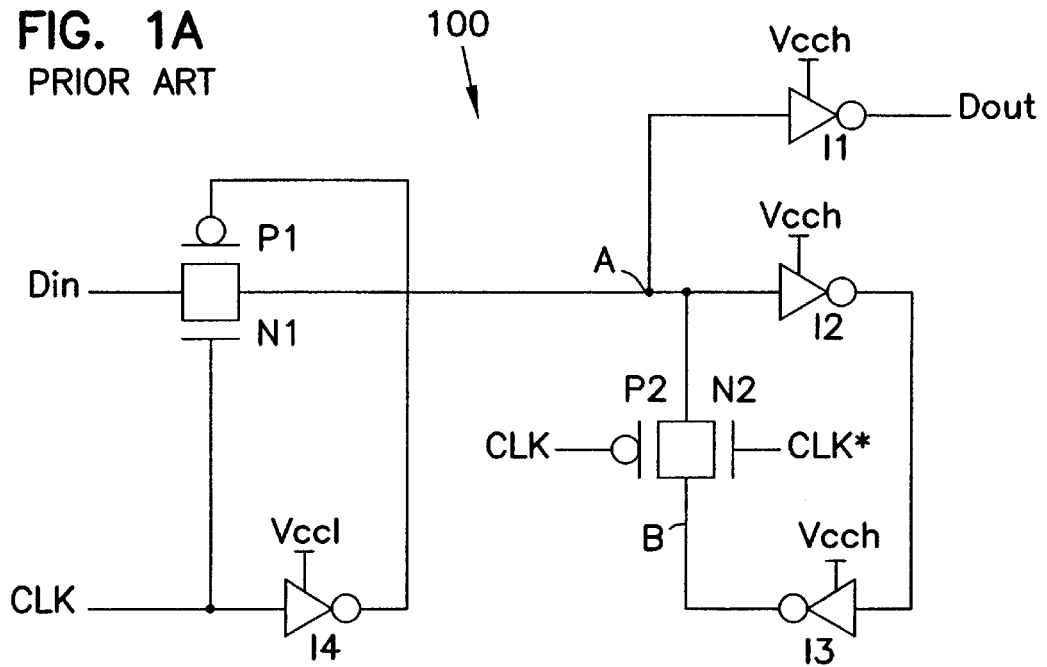
FIG. 1A and FIG. 1B show prior art latches.
Figure 1B:
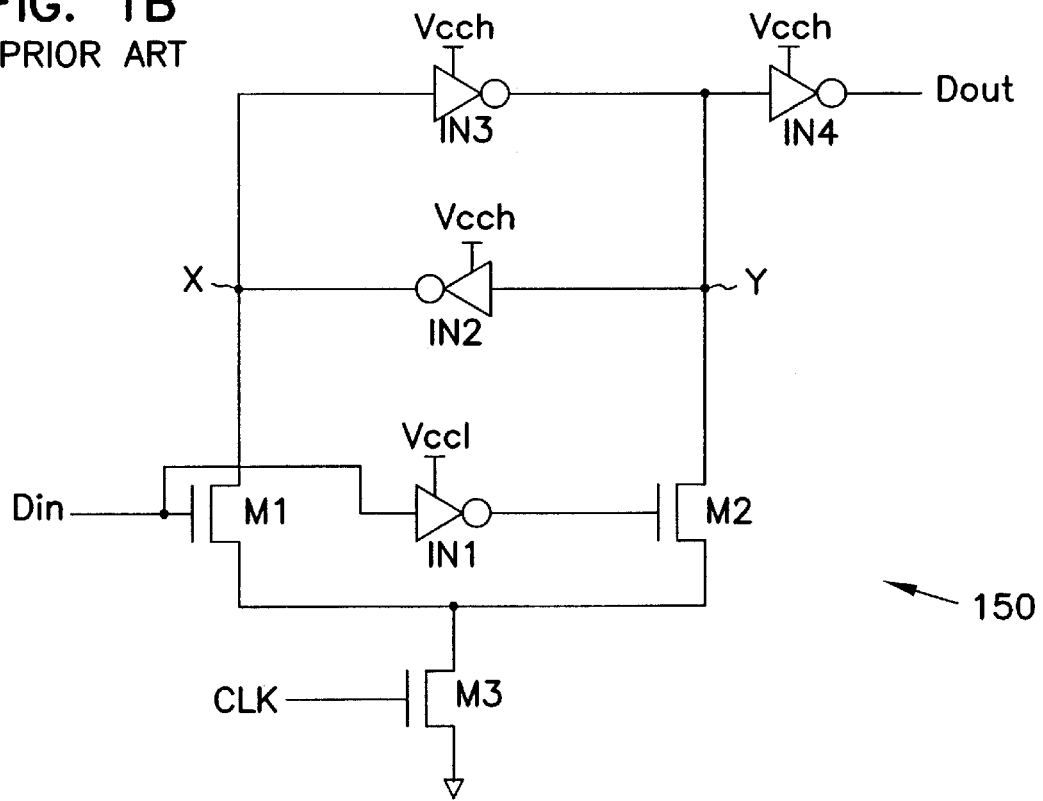

In the following detailed description of the embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, the various embodiments of the invention, although different, are not necessarily mutually exclusive. For example, a particular feature, structure, or characteristic described in one embodiment may be included within other embodiments. Therefore, the following detailed description is not to be taken in a limiting sense, and the scope of the present invention is defined only by the appended claims, along with the full scope of equivalents to which such claims are entitled.

Figure 2:
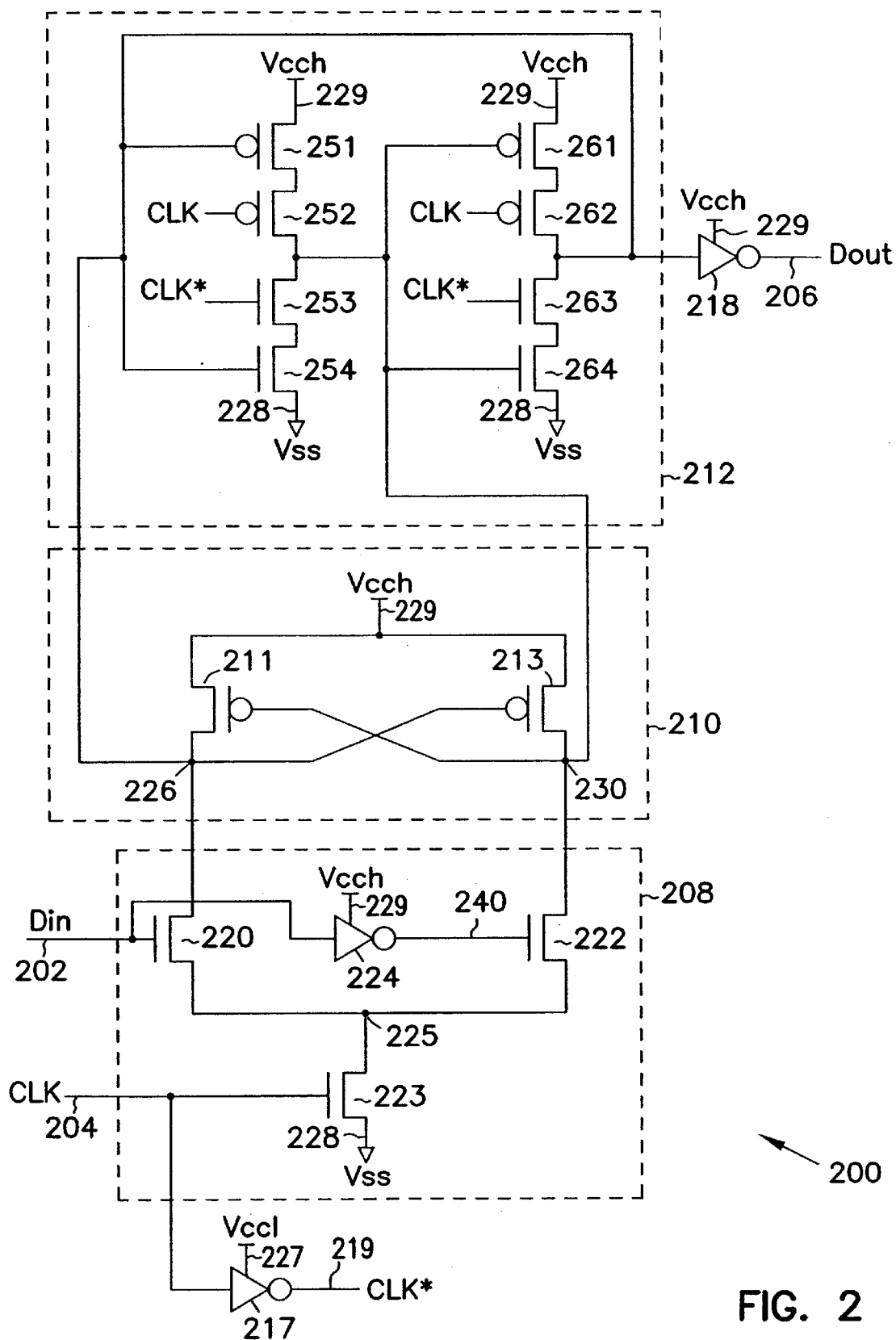
FIG. 2 shows a latch.

FIG. 2 shows a level converting latch 200. Latch 200 includes a data input node 202 to receive an input data signal Din, a clock input node 204 to receive a clock signal CLK, and a latch-out node 206 to output an output data signal Dout. In embodiments represented by FIG. 2, the Dout signal is an inverse version of the Din signal. Latch 200 also includes an input circuit 208, a pullup circuit 210, a feedback circuit 212, inverters 217 and 218, and a first and a second supply node 227 and 229.

First supply node 227 receives a first supply voltage Vccl; second supply node 229 receives a second supply voltage Vcch. In embodiments represented by FIG. 2, supply voltages Vccl and Vcch are unequal. Vccl and Vcch refer to dual-supply voltages and can be provided by any supply voltage source inside or outside latch 200.

Inverter 218 connects to supply node 229 to receive the supply voltage Vcch. Inverter 217 connects to supply node 227 to receive the supply voltage Vccl. In embodiments represented by FIG. 2, inverter 217 receives the CLK signal at its input and produces the CLK* signal at its output at node 219. The CLK* signal is a complement or an inverse version of the CLK signal. The Din and Dout signals are Vcch signals. The CLK and CLK* signals are Vccl signals. In some embodiments, inverter 217 is omitted and the CLK* signal is provided by another circuit outside latch 200.

Input circuit 208 includes input switches 220 and 222, a pulldown transistor 223, and an input inverter 224. In embodiments represented by FIG. 2, input switches 220 and 222 are represented by transistors 220 and 222. However, in some other embodiments, other types of switches can be used without departing from the scope of the invention. Transistor 220 has a drain and a source connected between a first internal node 226 and a pulldown node 225. Transistor 222 has a drain and a source connected between a second internal node 230 and pulldown node 225. Transistor 223 connects between pulldown node 225 and a reference node 228. Inverter 224 has an input connected to node 202 and a gate of transistor 220 and an output connected to a gate of transistor 222 at node 240. Inverter 218 also connects to supply node 229 to receive the supply voltage Vcch. Reference node 228 has a reference potential level indicated by Vss.

Pullup circuit 210 includes pullup transistors 211 and 213. Transistors 211 and 213 cross-couple to each other such that their sources connect together, a drain of transistor 211 connects to a gate of transistor 213, and a drain of transistor 213 connects to a gate of transistor 211. The gate of transistor 211 connects to node 230. The gate of transistor 213 connects to node 226. Cross-coupled transistors 211 and 213 connect to a supply node 229 at their sources to receive the supply voltage Vcch. Inverter 218 connects between feedback circuit 212 and node 206 to serve as a buffer. In some embodiments, inverter 218 is omitted.

Feedback circuit 212 includes a first and a second stack of transistors, each being connected between nodes 228 and 229. The first stack of transistors includes transistors 251, 252, 253 and 254. The second stack of transistors includes transistors 261, 262, 263 and 264. The first and second stacks of transistors respond to the CLK and CLK* signal control. The CLK signal at node 204 controls the gates of transistors 252 and 262. The CLK* signal at node 219 controls the gates of transistors 253 and 263.

The first stack of transistors operates as an inverter in response to one potential level of the CLK signal, in which the inverter has an input connected to internal node 226 and an output connected to internal node 230. The second stack of transistors operates as an inverter in response to one potential level of the CLK signal in which the inverter has an input connected to internal node 230 and an output connected to internal node 226. For example, when the CLK signal is at zero (CLK* is at Vccl), the first and second stack of transistors acts as inverters. Transistors 252, 253, 262 and 263 are isolation devices that isolate feedback circuit 212 from nodes 226 and 230 in response to another potential level of the CLK signal. For example, when the CLK signal is at Vccl (CLK* is at zero), transistors 252, 253, 262, and 263 turn off, isolating the first and second stacks of transistors from Vcch and Vss. This effectively isolates feedback circuit 212 from nodes 226 and 230.

In embodiments represented by FIG. 2, transistors 220, 222, 253, 254, 263, and 264 are n-channel metal oxide semiconductor field effect transistors (NMOSFETs), also referred to as "NFETs" or "NMOS." An NMOS transistor turns on to conduct current between its source and drain when its gate is at a high potential level, and turns off when its gate is at a low potential level. Transistors 211, 213, 251, 252, 261, and 262 are p-channel metal oxide semiconductor field effect transistors (PMOSFETs), also referred to as "PFETs" or "PMOS." A PMOS transistor turns on to conduct current between its source and drain when its gate is at a low potential level, and turns off when its gate is at a high potential level. Other types of transistors can also be used in place of the NMOS and PMOS transistors of FIG. 2. For example, embodiments exist that utilize bipolar junction transistors (BJTs) and junction field effect transistors (JFETs). One of ordinary skill in the art will understand that many other types of transistors can be utilized without departing from the scope of the present invention.

In embodiments represented by FIG. 2, a data path is formed from node 202 to node 206. The data path includes an input data path and an output data path. Elements of the input data path include nodes 202 and 240, inverter 224, and transistors 220 and 222. Elements of the output data path include nodes 226, 230, and 206, inverter 218, and the first and second stack of transistors. A clock path is formed from node 204 to the gates of transistors 223, 252, 253, 262, and 263. The clock path further includes inverter 217 and node 219.

Various embodiments of the circuits are described with reference to a Vccl signal and a Vcch signal. The Vccl signal has a reference potential level and a high potential level. The reference potential level corresponds to Vss, the high potential level corresponds to Vccl, in which Vccl is greater than Vss. Similarly, the Vcch signal has a reference potential level and a high potential level. The high potential level of the Vcch signal corresponds to Vcch, which is greater than Vccl. The reference potential level Vss of both Vccl and Vcch are the same. In the various embodiments of the circuits, Vss is zero or ground. However, in some other embodiments, Vss can be at different values.

Figure 3:
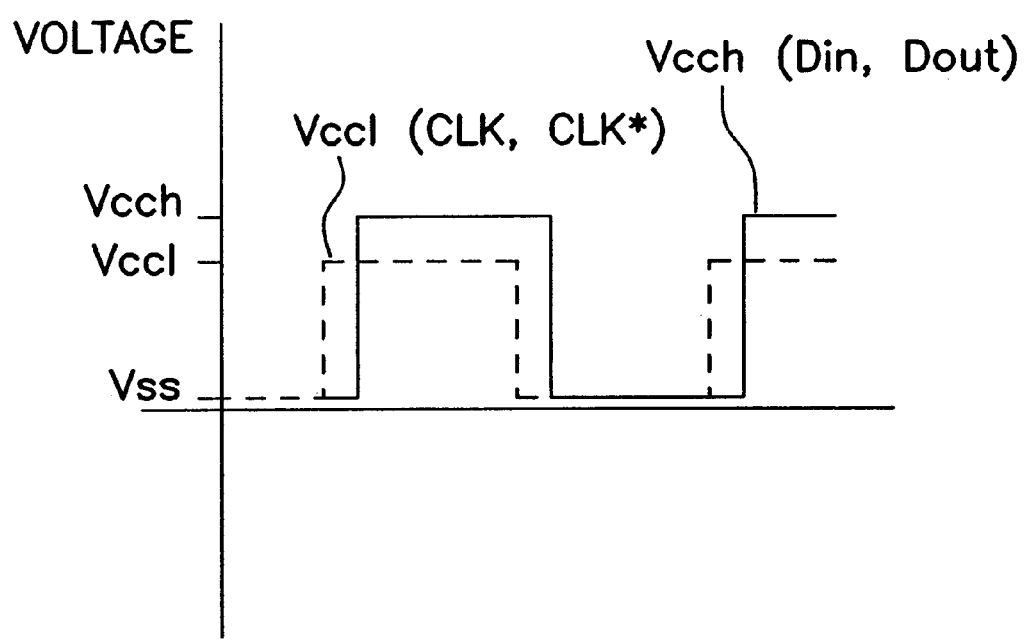
FIG. 3 shows an example of a Vccl and a Vcch signal.

FIG. 3 shows an example of a Vccl signal and a Vcch signal. In the figure, the Vccl signal is indicated by the dashed line and the Vcch signal is indicated by the solid line. In some embodiments, the Vccl signal represents the CLK and CLK* signals and the Vcch signal represents the Din and Dout signals of the embodiments represented by FIG. 2. As shown in FIG. 3, the Din and Dout signals switch between the Vcch level and the reference potential level. The CLK and CLK* signals switch between the Vccl level and the reference potential level. The voltage level of Vcch is higher than the voltage level of Vccl. The levels of the Vccl and Vcch in relation to the reference potential level are not necessarily drawn to scale.

Referring again to FIG. 2, when the CLK signal switches from zero to Vccl, CLK* switches to zero. Transistor 223 turns on and acts as a pulldown device. Depending on the signal level of the Din signal, either transistor 220 or transistor 222 turns on. For example, if the Din signal is at zero level, node 202 will be at zero and node 240 will be at Vcch; transistor 220 will turn off and transistor 222 will turn on. If the Din signal is at Vcch level, node 202 will be at Vcch and node 240 will be at zero; transistor 220 will turn on and transistor 222 will turn off.

When transistors 220 and 223 turn on, node 226 discharges to Vss at node 228 via transistors 220 and 223.

When node 226 is at Vss, transistor 213 turns on and charges node 230 to Vcch. In the other case when transistors 222 and 223 turn on, node 230 discharges to Vss at node 228 via transistors 222 and 223. When node 230 is at Vss, transistor 211 turns on and charges node 226 to Vcch. Thus, when the CLK signal is at Vccl, nodes 226 and 230 are charged to opposite potential levels.

Transistors 252 and 262 turn off when the CLK signal is at Vccl. Transistors 253 and 263 also turn off because the CLK* signal is at zero. Since transistors 252, 253, 262 and 263 are off, feedback circuit 212 is not active and is isolated from nodes 226 and 230.

Thus, latch 200 is transparent as long as the CLK signal remains at Vccl. In this case, even if the present and previous potential levels of the Din signal are different, charge contention is reduced because feedback circuit 212 is isolated from nodes 226 and 230.

When the CLK signal switches from Vccl to zero, the CLK* signal switches to Vccl. Transistor 223 turns off, cutting off a path from node 226 or 230 to node 228. Therefore the potential level of the Din signal does not affect the potential level at nodes 226 and 230. However, transistors 252 and 262 turn on because the CLK signal is at zero. Transistors 253 and 263 also turn on because the CLK* signal is at Vccl. Since transistors 252, 253, 262 and 263 are on, feedback circuit 212 is active. This causes the first and second stacks of transistors to operate and retain the previous potential levels at nodes 226 and 230. The Dout signal at node 206 remains at the same potential level until the CLK signal switches to Vccl and the Din signal at node 202 changes value.

For example, if node 226 is at Vcch, node 230 is at zero, when the CLK signal switches to zero and CLK* signal switches to Vccl, transistors 252, 253, 262 and 263 turn on. Since node 226 is at Vcch, transistor 251 turns off and transistor 254 turns on, pulling node 230 to zero. When node 230 is at zero, transistor 264 turns off and transistor 261 turns on to pull node 226 to Vcch. This process retains the potential levels at nodes 226 and 230. If node 226 is at zero and node 230 is at Vcch, when the CLK signal switches to zero and CLK* signal switches to Vccl, transistors 252, 253, 262 and 263 turn on. In this case, since node 226 is at zero, transistor 254 turns off and transistor 251 turns on, pulling node 230 to Vcch. When node 230 is at Vcch, transistor 261 turns off and transistor 264 turns on to pull node 226 to zero. This process retains the potential levels at nodes 226 and 230.

Figure 4:
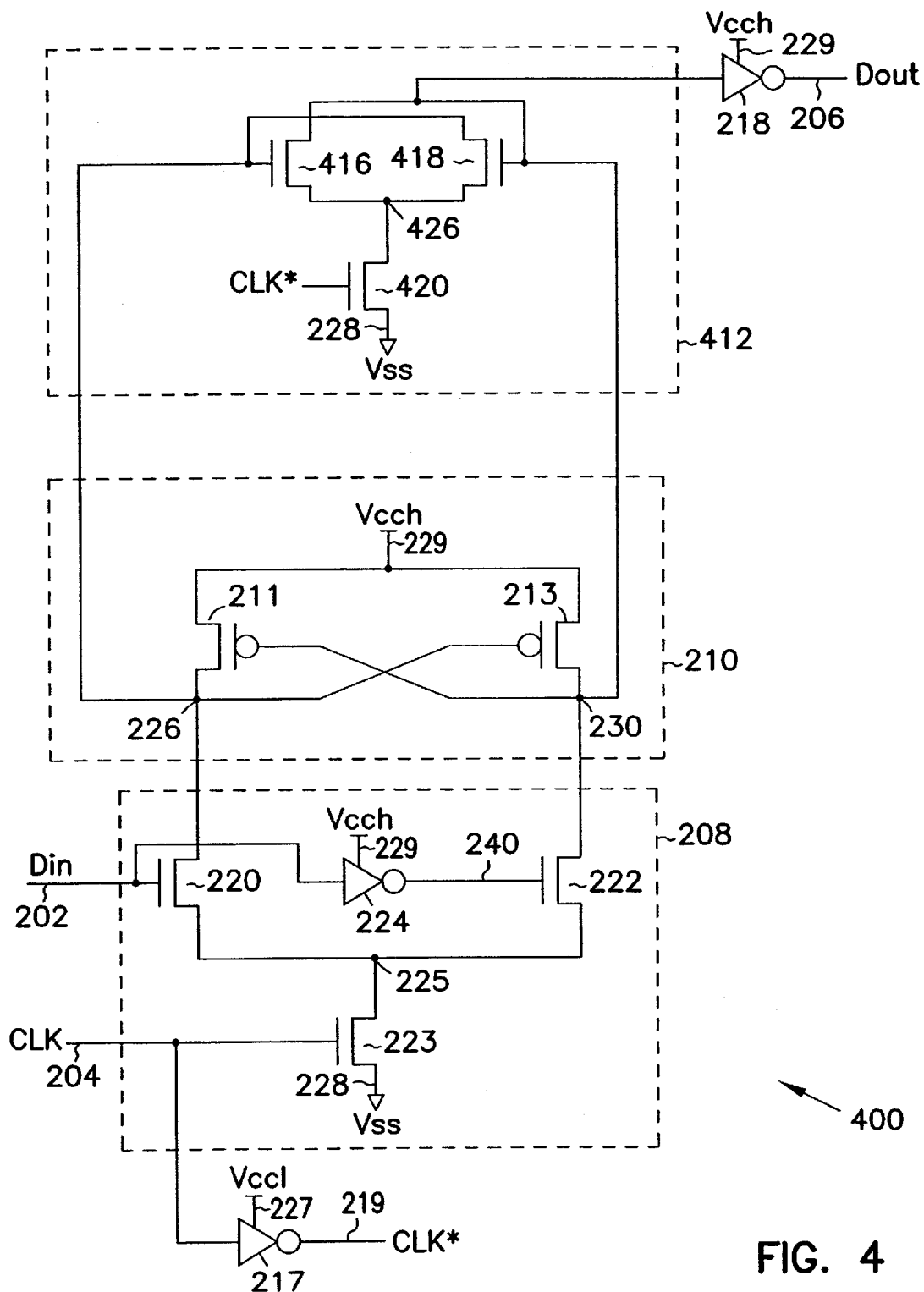
FIG. 4 shows a latch.

FIG. 4 shows a level converting latch 400. Latch 400 is the same as latch 200 except feedback circuit 412 has fewer transistors than feedback circuit 212 of FIG. 2.

Feedback circuit 412 includes feedback switches 416, 418, and 420. In embodiments represented by FIG. 4, feedback switches 416, 418, and 420 are represented by transistors 416, 418, and 420. However, in other types of switches can be used without departing from the scope of the invention. Transistors 416 and 418 have their sources connected together at a common node 426. A drain of transistor 416 connects to node 230 and a gate of transistor 418. A drain of transistor 418 connects to node 226 and a gate of transistor 416. A gate of transistor 416 connects to node 226 and a gate of transistor 418 connects to node 230. Transistor 420 is also referred to as an isolation device. Transistor 420 has a drain and a source connected between node 426 and reference node 228. A gate of transistor 420 connects to node 219 to receive the CLK* signal.

Embodiments represented by FIG. 4 include data and clock paths that are similar to the data and clock paths of embodiments represented by FIG. 2. In FIG. 4, however, the clock path is formed from node 204 and the gates of transistors 223 and 420 and includes inverter 217 and node 219.

The operation of latch 400 is similar to the operation of latch 200 of FIG. 2. When the CLK signal is at Vccl and the CLK* signal is at zero, nodes 226 and 230 are not affected by feedback circuit 412 because transistor 420 turns off. When transistor 420 turns off, it acts as an isolation device to isolate feedback circuit 412 from node 226 or 230 to Vss. This cuts off the flow of current from nodes 226 or 230 through feedback circuit 412 to node 228. Therefore, when cross-coupled transistors 211 and 213 selectively pull the potential levels at nodes 226 and 230 to zero and Vcch, the charge contention is reduced.

When the CLK signal switches to zero and the CLK* signal switches to Vccl, transistor 420 turns on. When transistor 420 is on, either transistor 416 or transistor 418 holds node 226 or 230 at zero. As a result, nodes 226 and 230 retain their potential levels through transistors 416, 418, 420, 211, and 213. For example, if node 226 is at Vcch and node 230 is at zero, when the CLK* signal switches to Vccl, transistor 420 turns on. Since node 226 is at Vcch, transistor 416 turns on and holds node 230 at zero. When node 230 is zero, transistor 211 turns on to pull node 226 to Vcch. Thus, nodes 226 and 230 retain their potential levels. If node 226 is at zero and node 230 is at Vcch, when the CLK* signal switches to Vccl, transistor 420 turns on. In this case, since node 230 is at Vcch, transistor 418 turns on and holds node 226 at zero. When node 226 is zero, transistor 213 turns on to pull node 230 to Vcch. Thus, nodes 226 and 230 retain their potential levels in this case.

Figure 5:
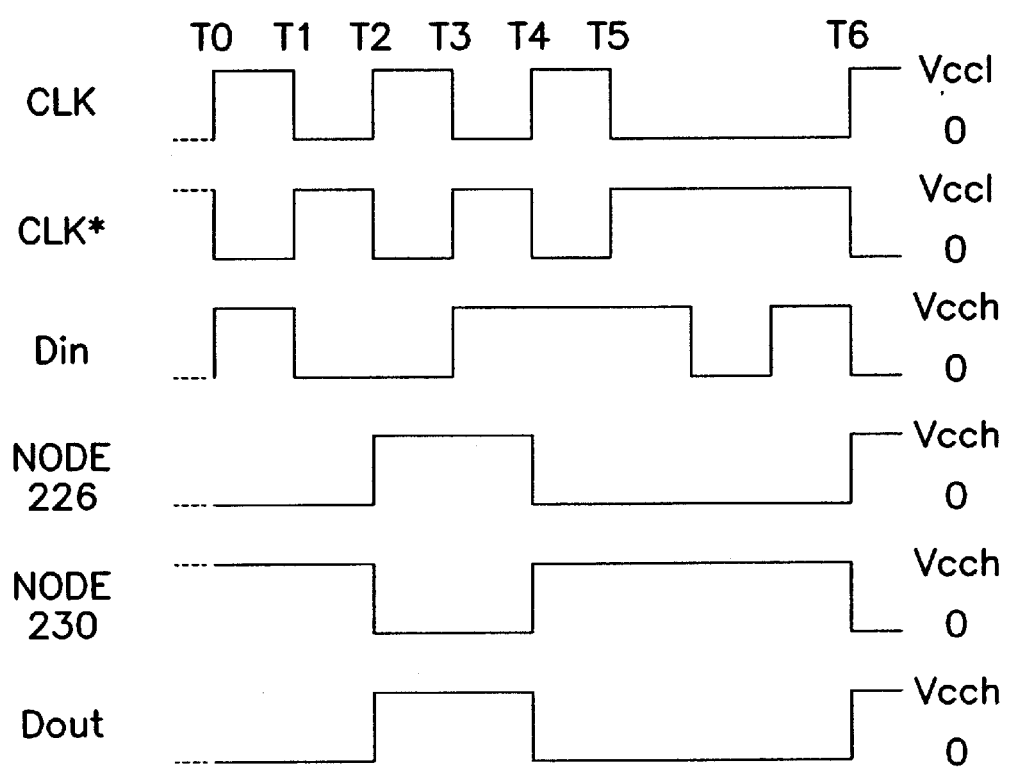
FIG. 5 is a timing diagram.

FIG. 5 is a timing diagram of latch 200 and latch 400. As shown in the figure, the CLK, CLK* signals switch between zero and Vccl potential levels. The signals at nodes 226, and 230, and the Din and Dout signals switch between zero and Vcch potential levels. As described in embodiments represented by FIGS. 2 and 4, nodes 226 and 230 have opposite potentials levels. FIG. 5 shows these opposite potential levels of nodes 226 and 230 between time T0 and T6. Also as described in the embodiments of FIGS. 2 and 4, when the CLK signal is at Vccl and the Din signal is at Vcch, node 226 is at zero. FIG. 5 shows that between times T0–T1, and T4–T5 node 226 is at zero. When the CLK signal is at Vccl and the Din signal is at zero, node 226 is at Vcch. FIG. 5 shows that between times T2–T3 node 226 is at Vcch. Between times T1–T2, and T3–T4, node 226 retains its previous potential levels because the CLK signal is at zero. Node 230 behaves in a similar but opposite manner from node 226. Therefore, node 230 has opposite potential levels from node 226. Between times T5–T6, nodes 226 and 230 retain their opposite potential levels regardless of changes in the Din signal because the CLK signal is at zero.

Figure 6:
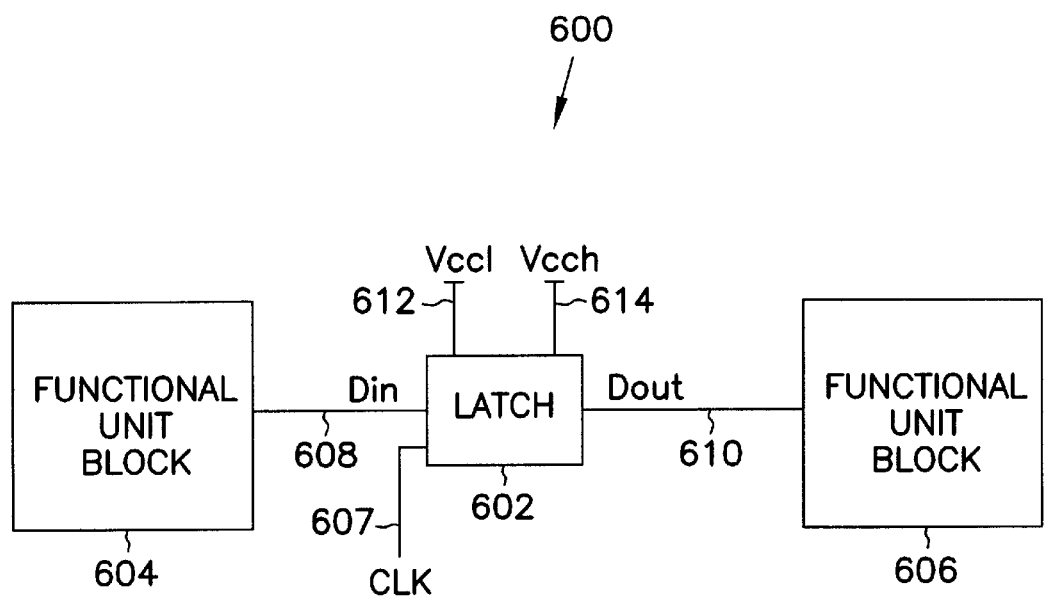
FIG. 6 shows an integrated circuit.

FIG. 6 shows an integrated circuit (IC) 600. Integrated circuit 600 includes a latch 602, a first functional unit block (FUB) 604, and a second FUB 606. Latch 602 connects to FUB 604 via line 608 to receive an input signal Din, and connects to FUB 606 via line 610 to output an output signal Dout. Latch 602 also connects to a clock input node 607 to receive a clock signal CLK.

Latch 602 connects to a supply node 612 to receive a supply voltage Vccl, and a supply node 614 to receive a supply voltage Vcch. Vccl and Vcch are unequal. Latch 602 is similar to latch 200 of FIG. 2 or latch 400 of FIG. 4. Therefore, the operation of latch 602 is also similar to the operation of latch 200 or latch 400. In operation, FUB 604 generates the Din signal on node 608. Latch 602 receives the Din signal and outputs the Vcch Dout signal based on the CLK signal. The Dout signal feeds into FUB 606 for further processing. The Din and Dout signals are Vcch signals and the CLK signal is a Vccl signal.

In embodiments represented by FIG. 6, IC 600 can be any type of integrated circuit. For example, IC 600 can be a processor such as a microprocessor, a digital signal processor, a microcontroller, or the like. IC 600 can also be an integrated circuit other than a processor such as an application-specific integrated circuit, a communications device, a memory controller, or a memory device such as a dynamic random access memory device.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed:

1. A latch comprising:
    an input circuit including a first and a second input switch connected together at a pulldown node, and a pulldown device connected between the pulldown node and a reference node;
    a pullup circuit connected to the first input switch at a first internal node and to the second input switch at a second internal node; and
    a feedback circuit including a first feedback switch connected to the first internal node and a second feedback switch connected to the second internal node, and an isolation device connected between the reference node and a node common to the first and second feedback switches.

2. The latch of claim 1, wherein the pullup circuit includes:
    a first transistor having a drain and a source connected between the first internal node and a first supply node, and a gate connected to the second internal node; and
    a second transistor having a drain and a source connected between the second internal node and the first supply node, and a gate connected to the first internal node.

3. The latch of claim 2, wherein the input circuit further includes an input inverter connected between a gate of the first input switch and a gate of the second input switch.

4. The latch of claim 3 further comprising:
    an output buffer connected between one of the internal nodes and an output node.

5. The latch of claim 3 further comprising:
    a data input node to receive a data signal, the data input node being connected to the gate of the first input switch; and
    a clock input node to receive a clock signal, the clock input node being connected to a gate of the pulldown device.

6. The latch of claim 5 further comprising a clock inverter having an input connected to the clock input node, and an output connected to a gate of the isolation device.

7. The latch of claim 6, wherein the first input switch includes a drain connected to the first internal node and a gate connected to the data input node, wherein the second input switch includes a drain connected to the second internal node.

8. The latch of claim 7 further comprising a second supply node to receive a supply voltage different from a supply voltage received at the first supply node, the second supply node being connected to the clock inverter.

9. The latch of claim 7, wherein each of the data and clock signals has a first and a second potential level, wherein the first potential levels of the data and clock signals are the same and the second potential levels of the data and clock signals are unequal.

10. A latch comprising:
    a first input transistor connected between a first internal node and a pulldown node;
    a second input transistor connected between a second internal node and the pulldown node, and an input inverter connected between a gate of the first input transistor and a gate of the second input transistor;
    a pulldown transistor connected between the pulldown node and a reference node;
    a first pullup transistor connected between the first internal node and a first supply node;
    a second pullup transistor connected between the second internal node and the first supply node; and
    a feedback circuit including a first feedback transistor connected between the first internal node and a common node, a second feedback transistor connected between the second internal node and the common node, and a third feedback transistor connected between the common node and the reference node.

11. The latch of claim 10, wherein the first pullup transistor includes a gate connected to the second internal node, and the second pullup transistor includes a gate connected to the first internal node.

12. The latch of claim 11 further comprising:
    a data input node to receive a data signal, the data input node being connected to a gate of the first input transistor; and
    a clock input node to receive a clock signal, the clock node being connected to a gate of the pulldown transistor.

13. The latch of claim 12 further comprising a clock inverter having an input connected to the clock input node, and an output connected to a gate of the third feedback transistor.

14. The latch of claim 12 further comprising a second supply node to receive a supply voltage different from a supply voltage received at the first supply node, the second supply node being connected to the clock inverter.

15. The latch of claim 12, wherein each of data and clock signals has a first and a second potential level, wherein the first potential levels of the data and clock signals are the same and the second potential levels of the data and clock signals are unequal.

16. The latch of claim 10 further comprising:
    an output buffer connected between one of the internal nodes and a latch-out node.

17. A latch comprising:
    a clock path including a first and a second clock node to provide complementary clock signals;
    a data path to receive a data signal, the data path including a first and a second input switch connected together at a pulldown node, and a pulldown device connected between the pulldown node and a reference node;
    a pullup circuit connected to the first input switch at a first internal node and to the second input switch at a second internal node; and
    a feedback circuit including a first stack of transistors connected to the first and second clock nodes and connected between the first and second internal nodes, and a second stack of transistors connected to the first and second clock nodes and connected between the first and second internal nodes.

18. The latch of claim 17, wherein first stack of transistors includes:
   a first transistor having a gate connected to the first clock node; and
   a second transistor having a gate connected to the second clock node, wherein the first and second transistors having their drains connected to one of the internal nodes.

19. The latch of claim 18, wherein the second stack of transistors includes:
   a first transistor having a gate connected to the first clock node; and
   a second transistor having a gate connected to the second clock node, wherein the first and second transistors of the second stack of transistors having their drains connected to the other of the internal nodes.

20. The latch of claim 19, wherein each of the first and second stacks of transistors includes third and fourth transistors having their gates connected to one of the internal nodes, wherein the first, second, third, and fourth transistors of each of the first and second stacks of transistors connects in series and in between a supply node and the reference node.

21. The latch of claim 20, wherein one of the complementary clock signals has a first and a second potential level and the data signal has a first and a second potential level, and wherein the first potential levels of the data signal and one of the clock signals are the same and the second potential levels of the data signal and one of the clock signals are unequal.

22. An integrated circuit comprising:
   a first functional unit to output a data signal; and
   a latch connected to the first functional unit, the latch including:
      a clock path to receive a clock signal, the clock path being connected to a pulldown device;
      a data path to receive the data signal to produce an output signal at an output node, the data path including a first transistor connected between a first internal node and the pulldown device, a second transistor connected between a second internal node and the pulldown device, and an inverter connected between one of the internal nodes and the output node;
      a pullup circuit connected between a supply node and the first and second internal nodes; and
      a feedback circuit including a first feedback transistor connected between the first internal node and a common node, a second feedback transistor connected between the second internal node and the common node, and a third feedback transistor connected to the common node and the clock path.

23. The integrated circuit of claim 22 further comprising a second functional unit connected to the latch to receive the output signal.

24. The integrated circuit of claim 23, wherein the clock path includes a second inverter connected between a gate of the pulldown device and a gate of the third feedback transistor.

25. The integrated circuit of claim 22, wherein the pullup circuit includes:
   a first transistor having a source and a drain connected between the first internal node and the supply node, and a gate connected to the second internal node; and
   a second transistor having a source and a drain connected between the second internal node and the supply node, and a gate connected to the first internal node.

26. The integrated circuit of claim 25, wherein each of data and clock signals has a first and a second potential level, wherein the first potential levels of the data and clock signals are the same and the second potential levels of the data and clock signals are unequal.

27. The integrated circuit of claim 22 further comprising a processor.

* * * * *